United States Patent
Dai et al.

(10) Patent No.: US 8,058,912 B2
(45) Date of Patent: Nov. 15, 2011

(54) ELECTRONIC DEVICE AND SIGNAL GENERATOR THEREOF

(75) Inventors: Lung Dai, Taipei Hsien (TW); Wang-Chang Duan, Shenzhen (CN); Yu-Wei Cao, Shenzhen (CN); Bang-Sheng Zuo, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/615,193

(22) Filed: Nov. 9, 2009

(65) Prior Publication Data

US 2010/0156478 A1    Jun. 24, 2010

(30) Foreign Application Priority Data

Dec. 18, 2008   (CN) .......................... 2008 1 0306366

(51) Int. Cl.
*H03L 7/00*   (2006.01)
(52) U.S. Cl. ........................................ 327/143; 327/198
(58) Field of Classification Search .................. 327/143, 327/198
See application file for complete search history.

(56) References Cited

U.S. PATENT DOCUMENTS

| | | | | |
|---|---|---|---|---|
| 4,103,187 A * | 7/1978 | Imamura | ....................... | 327/437 |
| 4,520,418 A * | 5/1985 | Susi | .................. | 361/92 |
| 4,748,352 A * | 5/1988 | Kamiya et al. | ................. | 327/143 |
| 5,140,178 A * | 8/1992 | Yoshihara et al. | ............ | 327/198 |
| 5,149,987 A * | 9/1992 | Martin | ............................. | 327/143 |
| 5,345,307 A | 9/1994 | Ishigami | | |
| 5,374,923 A * | 12/1994 | Sakamoto | ....................... | 340/654 |
| 5,442,312 A * | 8/1995 | Walter | ............................. | 327/198 |
| 5,543,741 A * | 8/1996 | Purits | ............................. | 327/143 |
| 5,564,010 A | 10/1996 | Henry et al. | | |
| 5,612,641 A * | 3/1997 | Sali | ................................. | 327/143 |
| 5,629,642 A * | 5/1997 | Yoshimura | ....................... | 327/142 |
| 5,703,510 A * | 12/1997 | Iketani et al. | .................. | 327/143 |
| 5,748,948 A | 5/1998 | Yu et al. | | |
| 5,778,238 A * | 7/1998 | Hofhine | .......................... | 713/340 |
| 5,781,051 A * | 7/1998 | Sandhu | ........................... | 327/143 |
| 5,812,001 A * | 9/1998 | Imamiya | ......................... | 327/198 |
| 5,847,586 A * | 12/1998 | Burstein et al. | ............... | 327/143 |
| 5,852,377 A * | 12/1998 | Pitsch | ............................. | 327/143 |
| 6,367,024 B1 * | 4/2002 | Ezell | ............................... | 713/340 |
| 6,476,651 B1 * | 11/2002 | Watanabe | ....................... | 327/143 |
| 6,556,058 B2 * | 4/2003 | Ohbayashi et al. | ............ | 327/143 |
| 6,812,751 B2 * | 11/2004 | Sutandi et al. | ................. | 327/143 |
| 6,911,852 B2 * | 6/2005 | Matsushita | ..................... | 327/143 |
| 6,937,074 B2 * | 8/2005 | Shin | ................................ | 327/143 |
| 6,954,379 B2 * | 10/2005 | Chou | ........................... | 365/185.2 |
| 6,982,577 B2 * | 1/2006 | Sekino et al. | .................. | 327/143 |
| 7,135,989 B2 * | 11/2006 | Parsons | .......................... | 340/907 |
| 7,142,024 B2 * | 11/2006 | Youssef | .......................... | 327/143 |
| 7,417,476 B1 * | 8/2008 | Hung | .............................. | 327/143 |
| 7,612,588 B2 * | 11/2009 | Kimura | ........................... | 327/143 |
| 7,750,684 B2 * | 7/2010 | Jurasek et al. | .................. | 327/47 |

* cited by examiner

*Primary Examiner* — Kenneth B. Wells
(74) *Attorney, Agent, or Firm* — Altis Law Group, Inc.

(57) ABSTRACT

An electronic device includes a signal generator and a processing module. The signal generator generates reset signals to reset the processing module. The signal generator includes a first capacitor, a second capacitor, and a switching unit. The first capacitor receives an input voltage and charges accordingly when the electronic device is powered on. The second capacitor generates the reset signals based on the input voltage. The switching unit transmits the input voltage to the second capacitor to charge the second capacitor when the electronic device is powered on, and grounds the second capacitor after the electronic device is powered off. The reset signals are generated during the charging and discharging process of the second capacitor.

16 Claims, 4 Drawing Sheets

ELECTRONIC DEVICE AND SIGNAL GENERATOR THEREOF

BACKGROUND

1. Technical Field

The present disclosure generally relates to signal generators, and particularly to a reset signal generator for an electronic device.

2. Description of Related Art

Most electronic devices, such as portable computers, cameras, media players, have data processing modules and a microcontroller. The microcontroller is configured for generating a reset signal when power is applied to the electronic device. The reset signal is then sent to the data processing modules to reset the data processing modules, thus ensuring that the processing modules start operating in a known state. However, the processing modules cannot receive the reset signal when the electronic device starts abnormally. This may cause errors in data processing.

Therefore, an electronic device having an improved signal generator is needed in the industry to address the aforementioned deficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
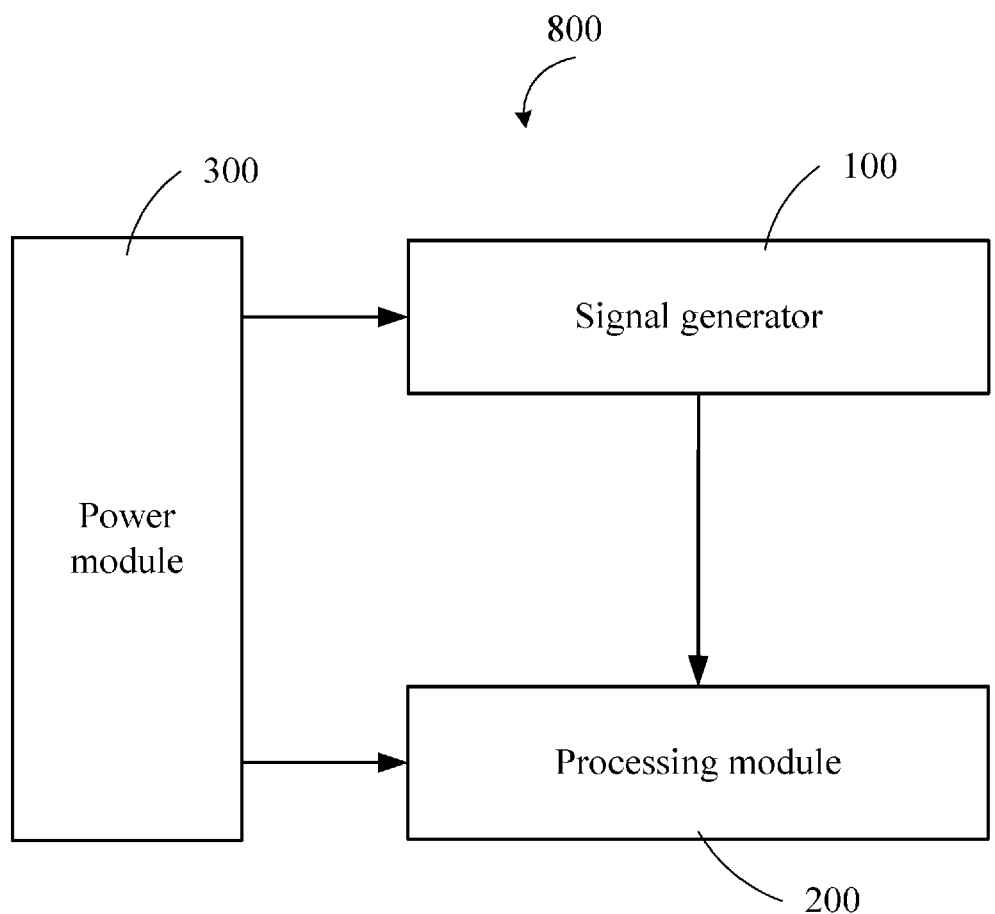
FIG. 1 is a block diagram showing an electronic device having a signal generator in accordance with an exemplary embodiment.

Referring to FIG. 1, an electronic device 800 including a signal generator 100, a processing module 200, and a power module 300 in accordance with an exemplary embodiment is illustrated. The electronic device 800 may be a computer, a mobile phone, a personal digital assistant (PDA), etc. The processing module 200 resets when supplied with a voltage lower than a predetermined value. Thus a signal lower than the predetermined value and sent to the processing module 200 acts as a reset signal. The signal generator 100 generates the reset signal when the electronic device 800 is powered on and also when the electronic device 800 is powered off. The signal generator 100 further supplies the reset signal to the processing module 200. The power module 300 supplies a direct current (DC) power to the signal generator 100 and the processing module 200 when the electronic device 800 is powered on.

Figure 2:
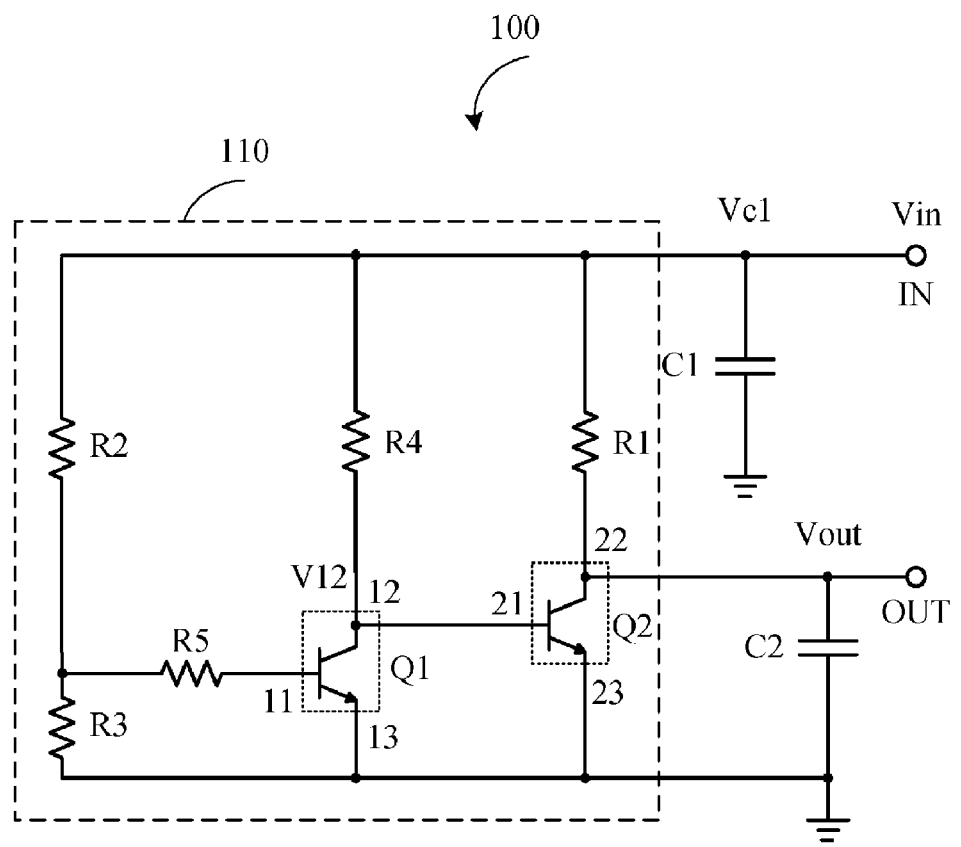
FIG. 2 is a circuit of the signal generator of FIG. 1 in accordance with a first exemplary embodiment.

Referring to FIG. 2, the signal generator 100 includes an input terminal IN, an output terminal OUT, a first capacitor C1, a second capacitor C2, and a switching unit 110. The switching unit 110 includes a first resistor R1, a second resistor R2, a third resistor R3, a fourth resistor R4, a fifth resistor R5, a first switch component Q1, and a second switch component Q2.

The input terminal IN receives the DC power from the power module 300 (FIG. 1). In the embodiment, the input terminal IN receives a constant DC voltage Vin from the power module 300 when the electronic device 800 is powered on. The output terminal OUT outputs an output signal Vout including the reset signals to reset the processing module 200. The first capacitor C1 filters out noise in the constant DC voltage, and is charged by the DC voltage Vin. The second capacitor C2 generates the output signal Vout based on the DC voltage Vin and outputs the output signal Vout to the output terminal OUT. The switching unit 110 is configured for transmitting the DC voltage Vin to the second capacitor C2. The DC voltage Vin charges the second capacitor C2 when the electronic device 800 is powered on. The switching unit 110 is further configured for grounding the second capacitor C2 when the electronic device 800 is powered off. The reset signals are generated when the second capacitor C2 charges and also when the second capacitor C2 discharges.

A terminal of the first capacitor C1, the first resistor R1, the second resistor R2, and the fourth resistor R4 is connected to the input terminal IN. The other terminal of the first capacitor C1 is grounded. The other terminal of the second resistor R2 is connected to the third resistor R3, and the third resistor R3 is grounded. The other terminal of the fourth resistor R4 is connected to a second terminal 12 of the first switch component Q1 and a first terminal 21 of the second switch component Q2. The other terminal of the first resistor R1 is connected to a second terminal 22 of the second switch component Q2, the output terminal OUT, and a terminal of the second capacitor C2. The other terminal of the second capacitor C2 is grounded. A first terminal 11 of the first switch component Q1 is connected to a connected node between the second and third resistors R2, R3 via the fifth resistor R5. A third terminal 13 of the first switch component Q1 is grounded. A third terminal 23 of the second switch component Q2 is grounded.

In the embodiment, the second resistor R2 is about three times the resistance of the third resistor R3. The first and the second switch components Q1, Q2 are both bipolar junction transistors (BJTs). The first terminals 11, 21 of the first and second switch components Q1, Q2 are bases, the second terminals 12, 22 of the first and second switch components Q1, Q2 are collectors, and the third terminals 13, 23 of the first and second switch components Q1, Q2 are emitters.

Figure 3:
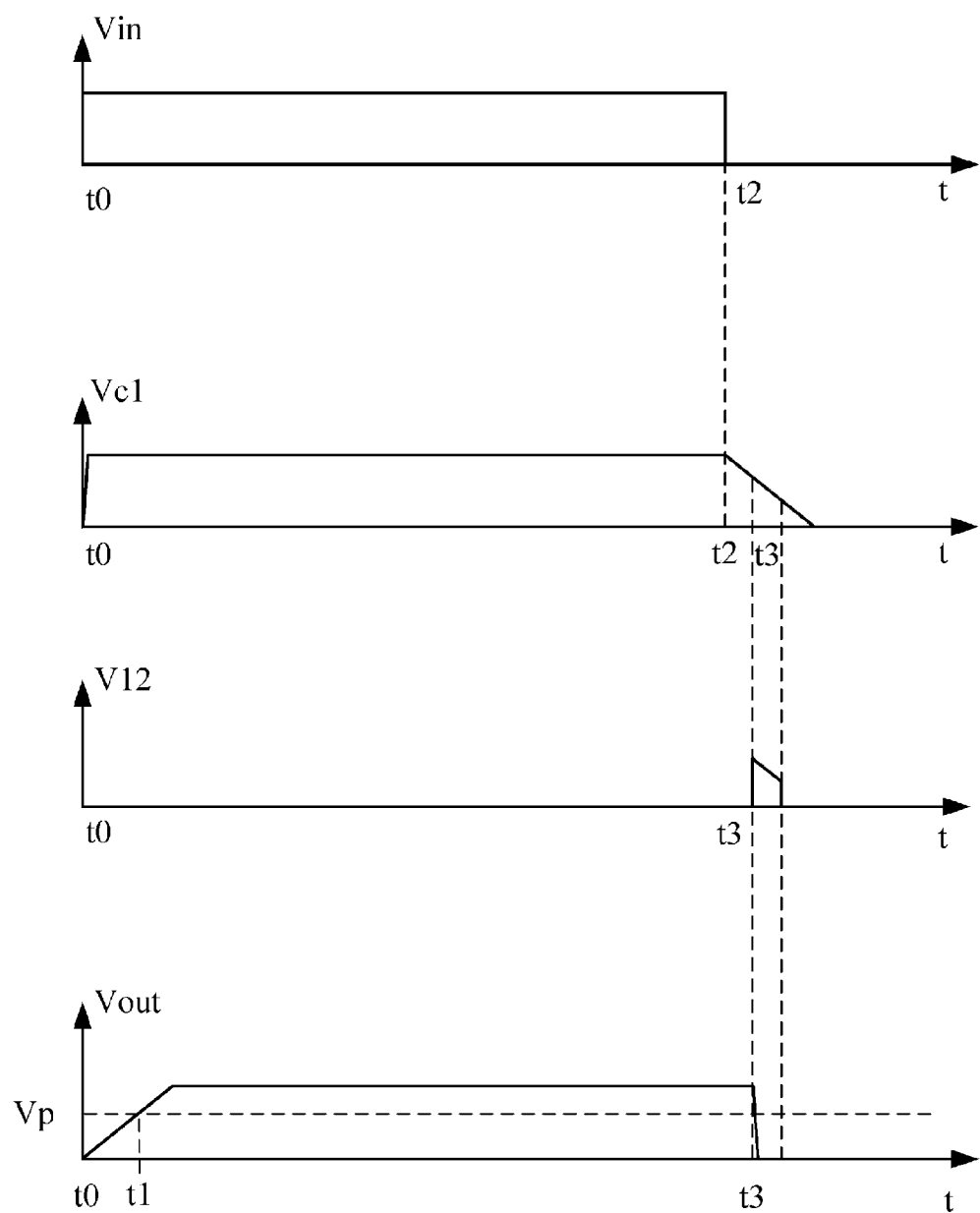
FIG. 3 is a graphical plot showing a direct current (DC) power supply and three waveforms generated by the signal generator of FIG. 2, as functions of operation time.

In operation, further referring to FIG. 3, when the electronic device 800 is powered on at time t0, the DC voltage Vin is supplied to the input terminal IN, the first capacitor C1 starts charging and filtering out noise in the DC voltage Vin and the second capacitor C2 starts charging via the first resistor R1. The output voltage Vout slowly increases to the predetermined value Vp before time t1, during this duration the processing module 200 reads the output voltage Vout as a reset signal and resets during the time period t0-t1. At the same time, the DC voltage Vin is applied to the base and the collector of the first switch component Q1 via the second, the fifth, and the fourth resistors R2, R5, R4. The first switch component Q1 becomes activated, and grounds the base of the second switch component Q2. Thus the second switch component Q2 remains in an off-state, and a voltage V12 at the second terminal 12 of the first switch component Q1 is a low voltage (zero volts).

When the electronic device 800 is powered off at time t2, the DC voltage Vin is removed from the input terminal IN, the first capacitor C1 starts discharging via the resistors R2-R4 and the first switch component Q1. Normally, there is a capacitor disposed at an input terminal of the processing module 200, thus, when the DC voltage Vin is no longer sent to the input terminal IN, the processing module 200 can also operate for a short time period based on the discharge time of the capacitor. Assuming a base threshold voltage of the first switch component Q1 is 0.7V (volts), because the second resistor R2 is about three times the resistance of the third resistor R3, when a voltage Vc1 representing a remaining voltage of the first capacitor C1 drops to or below about 2.8V, the first switch component Q1 turns off, and the first capacitor C1 continues discharging via the resistors R2-R3. The voltage V12 is a high voltage that almost equals the voltage Vc1, and the second switch component Q2 turns on and grounds the second capacitor C2. The second capacitor C2 discharges rapidly and the output voltage Vout drops quickly. After the output voltage Vout drops below the predetermined value Vp, it acts as the reset signal to the processing module 200, and thus the processing module 200 resets after the time t3.

To summarize, the signal generator 100 is capable of generating the reset signal when the electronic device 800 is powered on and when the electronic device 800 is powered off. Furthermore, the first switch component Q1 is configured to turn on to keep the second switch component Q2 in the off-state, and charge the second capacitor C2 when the electronic device 800 is powered on. The reset signal is generated when the second capacitor C2 charges. The first switch component Q1 is further configured to turn off to turn on the second switch component Q2, thereby grounding the second capacitor C2 when the electronic device 800 is powered off, and thus the second capacitor C2 discharges rapidly and the reset signal is generated when the second capacitor C2 discharges.

Figure 4:
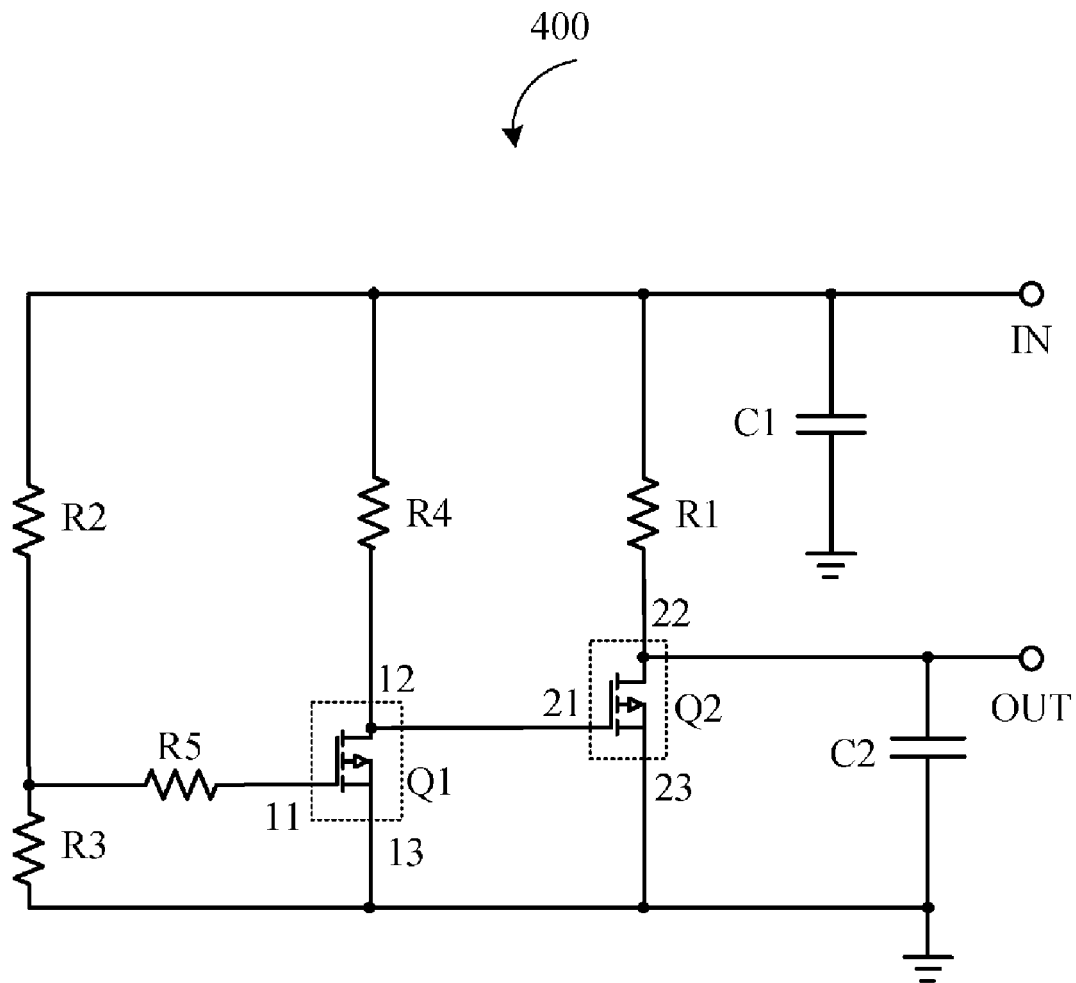
FIG. 4 is a circuit of the signal generator of FIG. 1 in accordance with a second exemplary embodiment.

Referring to FIG. 4, in a second exemplary embodiment, a signal generator 400 has a similar structure to the signal generator 100. The signal generator 400 includes a first switch component Q1 and a second switch component Q2 that are both field effect transistors. The first terminals 11, 21 of the first and second switch components Q1, Q2 are gates, the second terminals 12, 22 of the first and second switch components Q1, Q2 are drains, and the third terminals 13, 23 of the first and second switch components Q1, Q2 are sources. The operation principle of the signal generator 400 is similar to that of the signal generator 100.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:
a signal generator for generating reset signals when the electronic device is powered on and when the electronic device is powered off; and
a processing module resetting in response to the reset signals;
the signal generator comprising:
a first capacitor receiving an input voltage and charging accordingly when the electronic device is powered on;
a second capacitor for generating the reset signals based on the input voltage;
a switching unit for transmitting the input voltage to the second capacitor to charge the second capacitor when the electronic device is powered on, and grounding the second capacitor after the electronic device is powered off;
an input terminal for receiving the input voltage; and
an output terminal for outputting the reset signals;
wherein one terminal of the first capacitor is connected to the input terminal, the other terminal of the first capacitor is grounded, one terminal of the second capacitor is connected to the output terminal, the other terminal of the second capacitor is grounded, the reset signals are generated during the charging and discharging process of the second capacitor; the switching unit comprises:
a first switch component configured to turn on when the electronic device is powered on, and turn off after the electronic device is powered off;
a second switch component configured to keep an off-state to cause the second capacitor to be charged by the input voltage when the first switch component turns on, and configured to turn on to ground the second capacitor when the first switch component turns off;
a first resistor;
a second resistor;
a third resistor; and
a fourth resistor; a terminal of each of the first resistor, the second resistor, and the fourth resistor is connected to the input terminal; the other terminal of the second resistor is grounded via the third resistor; the other terminal of the fourth resistor is connected to a second terminal of the first switch component and a first terminal of the second switch component; the other terminal of the first resistor is connected to a second terminal of the second switch component, the second terminal of the second switch component is connected to the output terminal, a first terminal of the first switch component is connected to a connected node between the second and third resistors; a third terminal of the first switch component is grounded, and a third terminal of the second switch component is grounded.

2. The electronic device of claim 1, wherein a value of the reset signal is lower than a predetermined value lower than the input voltage.

3. The electronic device of claim 1, wherein the signal generator further comprises a fifth resistor connected between the first terminal of the first switch component and the connected node between the second and third resistors.

4. The electronic device of claim 1, wherein the resistance of the second resistor is about three times the resistance of the third resistor.

5. The electronic device of claim 1, wherein the first and the second switch components are both bipolar junction transistors.

6. The electronic device of claim 5, wherein the first terminals of the first and second switch components are bases, the second terminals of the first and second switch components are collectors, and the third terminals of the first and second switch components are emitters.

7. The electronic device of claim 1, wherein the first and the second switch components are field effect transistors.

8. The electronic device of claim 7, wherein the first terminals of the first and second switch components are gates, the second terminals of the first and second switch components are drains, and the third terminals of the first and second switch components are sources.

9. A signal generator for generating reset signals, the signal generator comprising:

a first capacitor for receiving an input voltage and charging accordingly;

a second capacitor for generating the reset signals based on the input voltage; and a switching unit for transmitting the input voltage to the second capacitor to charge the second capacitor when the input voltage is supplied to the first capacitor, and grounding the second capacitor after the input voltage is no longer sent to the first capacitor;

an input terminal for receiving the input voltage; and an output terminal for outputting the reset signals;

wherein one terminal of the first capacitor is connected to the input terminal, the other terminal of the first capacitor is grounded, one terminal of the second capacitor is connected to the output terminal, the other terminal of the second capacitor is grounded, the reset signals are generated during the charging and discharging of the second capacitor; the switching unit comprises:

a first switch component configured to turn on when the input voltage is supplied to the first capacitor, and turn off after the input voltage is removed; and a second switch component configured to maintain an off-state to cause the second capacitor to be charged with the input voltage when the first switch component turns on, and configured to turn on to ground the second capacitor when the first switch component turns off;

a first resistor;

a second resistor;

a third resistor; and a fourth resistor; a terminal of each of the first resistor, the second resistor, and the fourth resistor is connected to the input terminal; the other terminal of the second resistor is grounded via the third resistor; the other terminal of the fourth resistor is connected to a second terminal of the first switch component and a first terminal of the second switch component; the other terminal of the first resistor is connected to a second terminal of the second switch component, the second terminal of the second switch component is connected to the output terminal, a first terminal of the first switch component is connected to a connected node between the second and third resistors; a third terminal of the first switch component is grounded, and a third terminal of the second switch component is grounded.

10. The signal generator of claim 9, wherein a value of the reset signal is lower than a predetermined value lower than the input voltage.

11. The signal generator of claim 9, wherein the signal generator further comprises a fifth resistor connected between the first terminal of the first switch component and the node between the second and third resistors.

12. The signal generator of claim 9, wherein the resistance of the second resistor is about three times the resistance of the third resistor.

13. The signal generator of claim 9, wherein the first and the second switch components are both bipolar junction transistors.

14. The signal generator of claim 13, wherein the first terminals of the first and second switch components are bases, the second terminals of the first and second switch components are collectors, and the third terminals of the first and second switch components are emitters.

15. The signal generator of claim 9, wherein the first and the second switch components are field effect transistors.

16. The signal generator of claim 15, wherein the first terminals of the first and second switch components are gates, the second terminals of the first and second switch components are drains, and the third terminals of the first and second switch components are sources.

* * * * *